United States Patent
Jung et al.

(10) Patent No.: US 8,338,310 B2
(45) Date of Patent: Dec. 25, 2012

(54) METHOD OF FORMING LINE/SPACE PATTERNS

(75) Inventors: Sung-gon Jung, Seoul (KR); Suk-joo Lee, Yongin-si (KR); Woo-sung Han, Seoul (KR); Seong-woon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 403 days.

(21) Appl. No.: 12/786,466

(22) Filed: May 25, 2010

(65) Prior Publication Data

US 2010/0297852 A1    Nov. 25, 2010

(30) Foreign Application Priority Data

May 25, 2009   (KR) .................. 10-2009-0045468

(51) Int. Cl.
 *H01L 21/301* (2006.01)
(52) U.S. Cl. ........ 438/717; 438/714; 438/725; 438/736; 216/46; 430/312
(58) Field of Classification Search .................. 438/706, 438/13, 714, 717, 723, 725, 735, 736; 216/41, 216/47, 72; 430/310, 312, 313
See application file for complete search history.

(56) References Cited

U.S. PATENT DOCUMENTS 7,994,056 B2 * 8/2011 Shin et al. .................... 438/690

| | | | |
|---|---|---|---|
| 2007/0238053 A1* | 10/2007 | Hashimoto | 430/313 |
| 2008/0135948 A1* | 6/2008 | Wang | 257/392 |
| 2009/0111270 A1* | 4/2009 | Choi | 438/694 |
| 2010/0197096 A1* | 8/2010 | Johnson et al. | 438/268 |

FOREIGN PATENT DOCUMENTS

| KR | 10-0298458 | 5/2001 |
|---|---|---|
| KR | 1020030056390 | 7/2003 |
| KR | 1020060113162 A | 11/2006 |

* cited by examiner

*Primary Examiner* — Lan Vinh
(74) *Attorney, Agent, or Firm* — Volentine & Whitt, PLLC

(57) ABSTRACT

A method of forming a line/space pattern includes forming a plurality of first pattern structures on a layer of hard mask material disposed on a substrate, forming a plurality of second pattern structures along sidewalls of the first pattern structures, removing the first pattern structures such that the second pattern structures stand alone on the layer of hard mask material, forming a first mask that exposes a location where a space of the line/space pattern to be formed is to have a width greater than the distance between adjacent ones of the second pattern structures, removing those of the second pattern structures which are exposed by the first mask such that others of the second pattern structures remain on the layer of hard mask material, forming a second mask that covers a location where a line of the line/space pattern to be formed is to have a width that is greater than the widths of the second pattern structures, forming a hard mask by etching the hard mask material layer using the second mask and the remaining second pattern structures as an etch mask, and etching the substrate using the hard mask as an etch mask.

16 Claims, 10 Drawing Sheets

US 8,338,310 B2

METHOD OF FORMING LINE/SPACE PATTERNS

CROSS-REFERENCE TO RELATED APPLICATIONS

This application claims the benefit of Korean Patent Application No. 10-2009-0045468, filed on May 25, 2009, in the Korean Intellectual Property Office.

BACKGROUND

The inventive concept relates to a method of forming patterns of semiconductor devices or the like. More particularly, the inventive concept relates to a method of forming a line/space pattern of a semiconductor device.

In general, a double patterning method is used to form fine line/space patterns, e.g., circuit patterns, of semiconductor devices. Sometimes, though, the pattern to be formed will include bit lines and fine lines in the same region of the device. In general, the widths of the bit lines are greater than those of the fine lines of the pattern. However, a defect in the line/space pattern may be caused by the optical proximity effect when both fine lines and bit lines are formed at the same time using photolithography.

SUMMARY

According to an aspect of the inventive concept, there is provided a method of forming a line/space pattern which includes providing a substrate on which a layer of hard mask material is disposed, forming a plurality of first line pattern structures on the layer of hard mask material, forming a plurality of second pattern structures in the form of sidewall spacers along the sidewalls of the first pattern structures, respectively, subsequently removing the first pattern structures, forming a first mask that exposes adjacent ones of the second pattern structures and covers others of the second pattern structures, removing the second pattern structures which are exposed by the first mask in the first region, forming a second mask that covers a section of the layer of hard mask material located between respective ones of the remaining second pattern, forming a hard mask by etching the layer of hard mask material using the second mask and the remaining second pattern structures as an etch mask, and etching the substrate using the hard mask as an etch mask.

According to another aspect of the inventive concept, there is provided a method of forming a line/space pattern which includes providing a substrate on which a layer of hard mask material is disposed, forming a plurality of first pattern structures on the layer of hard mask material, forming a plurality of second pattern structures along sidewalls of the first pattern structures, removing the first pattern structures such that the second pattern structures stand alone on the layer of hard mask material, forming a first mask that exposes a location where a space of the line/space pattern to be formed is to have a width greater than the distance between adjacent ones of the second pattern structures, removing those of the second pattern structures which are exposed by the first mask such that others of the second pattern structures remain on the layer of hard mask material, forming a second mask that covers a location where a line of the line/space pattern to be formed is to have a width that is greater than the widths of the second pattern structures, forming a hard mask by etching the hard mask material layer using the second mask and the remaining second pattern structures as an etch mask, and etching the substrate using the hard mask as an etch mask.

BRIEF DESCRIPTION OF THE DRAWINGS

The inventive concept will be more clearly understood from the following detailed description of the preferred embodiments thereof taken in conjunction with the accompanying drawings in which:

FIG. 1A-9B illustrate methods of forming a line/space pattern according to the inventive concept, wherein FIGS. 1A, 2A, 3A, 4A, 5A, 6A, and 7A are each a plan view of a substrate and illustrate the patterning of a sacrificial layer on the substrate according to the inventive concept, FIG. 8 is a cross-sectional view of the substrate illustrating a hard mask formed on the substrate according to the inventive concept, FIG. 9B is a cross-sectional view of the substrate taken along line B-B' of FIG. 9A.

DETAILED DESCRIPTION OF THE PREFERRED EMBODIMENTS

Figure 1A:
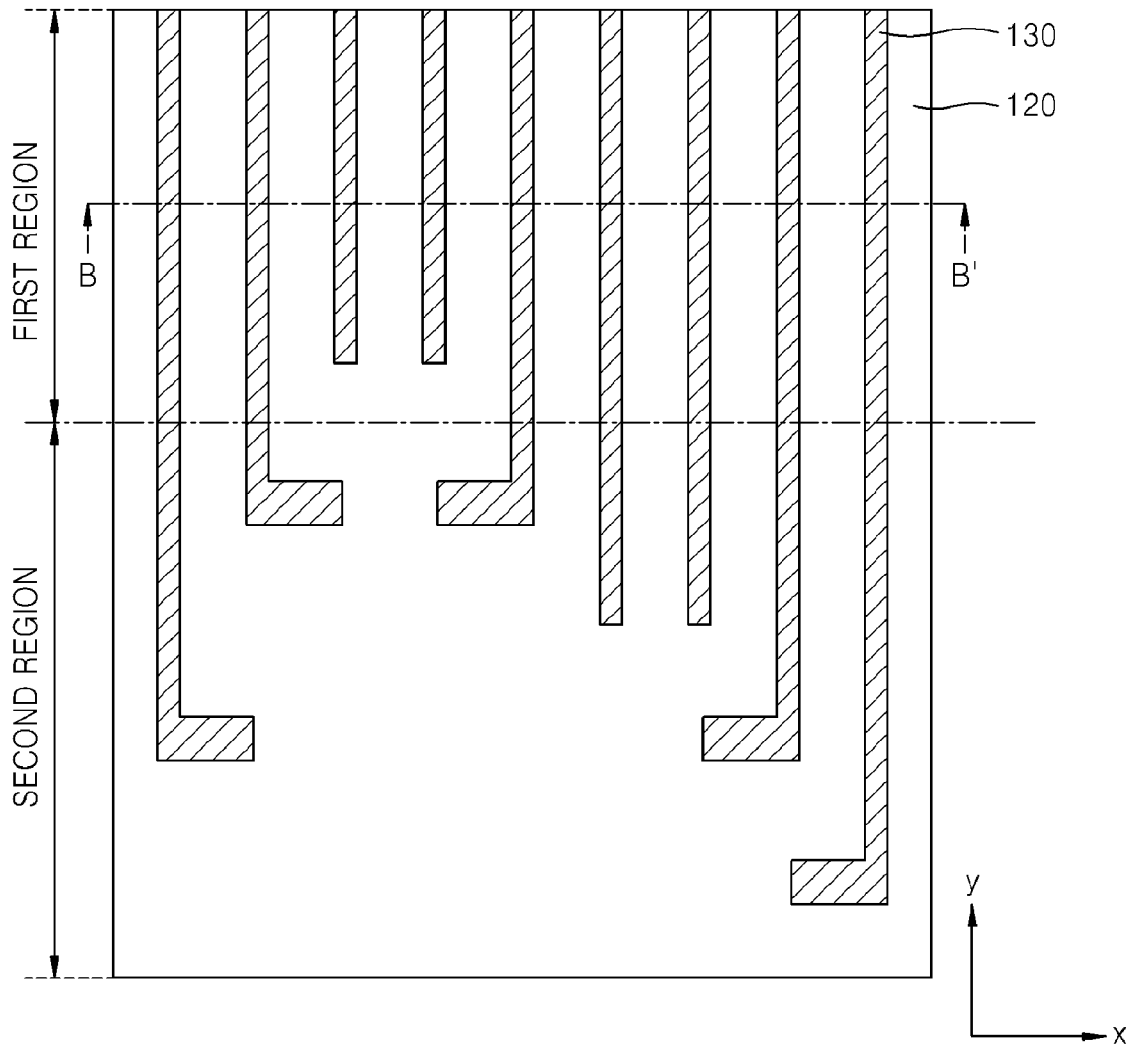

The inventive concept will be described more fully hereinafter with reference to the accompanying drawings. Like reference numerals denote like elements throughout the drawings. Also, the lengths and sizes of layers and regions may be exaggerated in the drawings for clarity.

It will also be understood that when an element or layer is described as being "on" another element or layer, such a description refers to both a case in which the element or layer is disposed directly on the another element or layer or the case in which other elements or layers are interposed therebetween. Furthermore, in the present disclosure, the term "line" refers to a feature of a pattern that protrudes from a flat surface, and at least a substantial portion of which has an elongated linear (straight) shape. The term "space" refers to the space between adjacent ones of such lines. The "widths" of lines and spaces referred to in the disclosure are thus the dimensions of the lines and spaces in a direction that is parallel to the flat surface and perpendicular to the lengthwise direction of the lines. The term "line/space pattern" will refer to a series of lines and spaces regardless of whether the widths of the lines are all the same, the widths of the spaces are the same or the spacing between the lines is regular (uniform). Furthermore, the term "spacer", as distinguished from the term "space", refers to a structure that is formed on a sidewall of a line.

A method of forming a line/space pattern according to the inventive concept will now be described in detail with reference to FIGS. 1A and 1B through 9A and 9B.

Figure 1B:
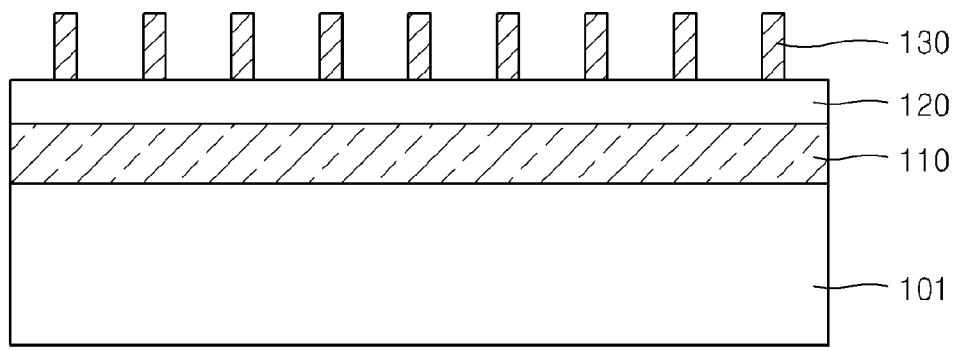
FIGS. 1B, 2B, 3B, 4B, 5B, 6B, 7B are each a cross-sectional view of the substrate and are taken along lines B-B' of FIGS. 1A, 2A, 3A, 4A, 5A, 6A, and 7A, 8A and 9A, respectively.

Referring first to FIGS. 1A and 1B, a hard mask material layer 110 and a sacrificial material layer 120 are sequentially formed on a substrate 101 and a plurality of first pattern structures 130 are formed on the sacrificial material layer 120. As illustrated in FIG. 1A, the first pattern structures 130 extend longitudinally in the direction of a Y-axis (an arbitrary first direction) and are spaced from one another in the direction of an X-axis (a second direction perpendicular to the first direction). The first structures 130 are formed by a photolithographic process. The widths of the first pattern structures 130 may be equal to one another. Also, the first pattern structures 130 may be spaced from one another at regular intervals. These intervals are greater than the spacing of the features of the line/space pattern that will be formed using the first pattern structures 130. Thus, it is possible to minimize the optical proximity effect caused by the tendency of exposure light in a photolithographic process to distort if the process used to directly form too fine of a pattern.

Also, in the example shown in FIGS. 1A and 1B, the first pattern structures 130 are formed not only in a region in which the line/space pattern to be formed is to be essentially regular (uniform widths and spacing like the pattern of the first structures 130), but also in a region in which at least one line of the line/space pattern to be formed is to have a width greater than that of the lines of the regular line/space pattern, and in a region in which at least one of the spaces of the line/space pattern to be formed is to have a width greater than that of the spaces of the regular pattern. These regions are contained within the first and second regions identified in the figures and will become clearer from the description that follows with reference to FIGS. 4A to 9B.

The substrate 101 may be a semiconductor substrate, e.g., a silicon substrate doped with impurities. The hard mask material layer 110 may be a silicon nitride layer or a plasma enhanced oxide (PEOx) layer. The sacrificial material layer 120 may be formed of polysilicon. The first pattern structures 130 are formed of a material having an etch selectivity with respect to the sacrificial material layer 120. For example, the first pattern structures 130 may be formed of spin-on-glass (SOG). In this case, an SOG layer (not shown) and a photoresist layer (not shown) are formed on the sacrificial material layer 120, the photoresist layer is exposed and developed to form a photoresist pattern, and the SOG layer is etched using the photoresist pattern as an etch mask.

Figure 2A:
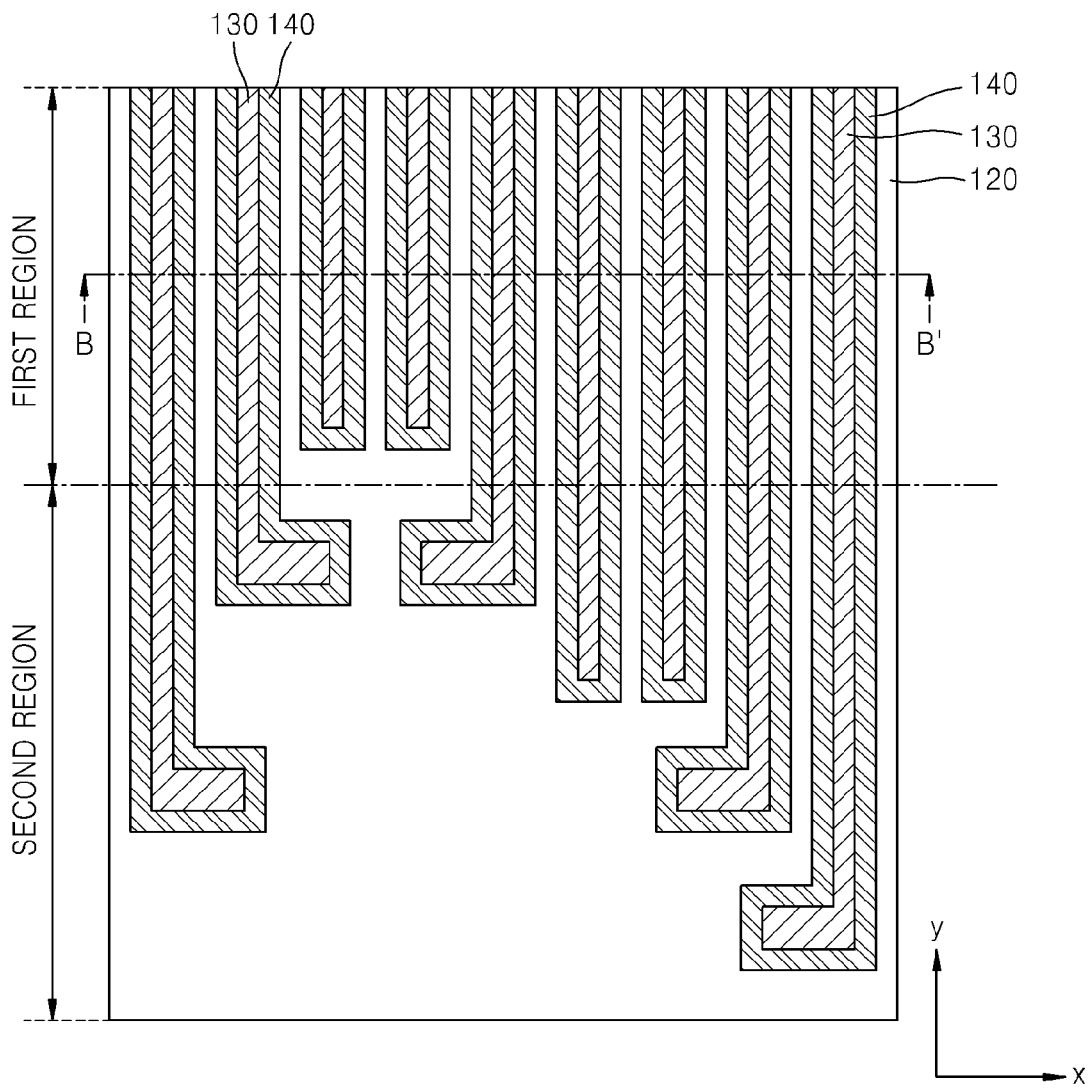
Figure 2B:
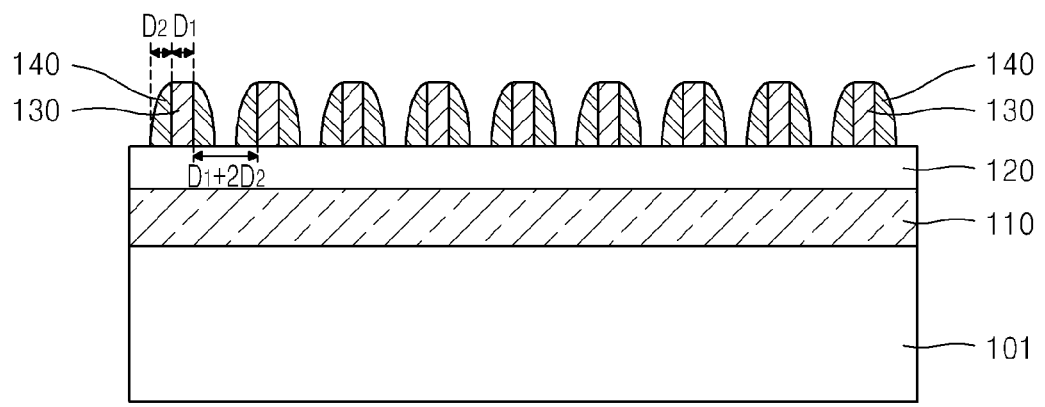

Next, referring to FIGS. 2A and 2B, second pattern structures 140 are formed on sidewalls of the first pattern structures 130. The second pattern structures 140 are formed of material having an etch selectivity with respect to the first pattern structures 130. For example, the second pattern structures 140 are formed of a silicon oxide. Furthermore, the second pattern structures 140 can be formed by any method of fabricating sidewalls spacers known, per se, in the art. For example, the second pattern structures 140 may be formed by forming a layer of material over the first pattern structures 130 and then anisotropically etching the resultant structure.

As illustrated in FIG. 2B, the first and second pattern structures 130 and 140 may be formed such that the distance between the first pattern structures 130 is D1+2D2, wherein D1 is the width of the first pattern structures 130, and D2 is the width of the second pattern structures 140. If, in this case, the width D2 of each of the second pattern structures 140 is equal to the width D1, then the distance between the first pattern structures 130 is 3D1, and the second pattern structures 140 are not only spaced the same distance apart from one another, but the distance between the second pattern structures 140 is also substantially equal to the width D2 of each of the second pattern structures 140.

Figure 3A:
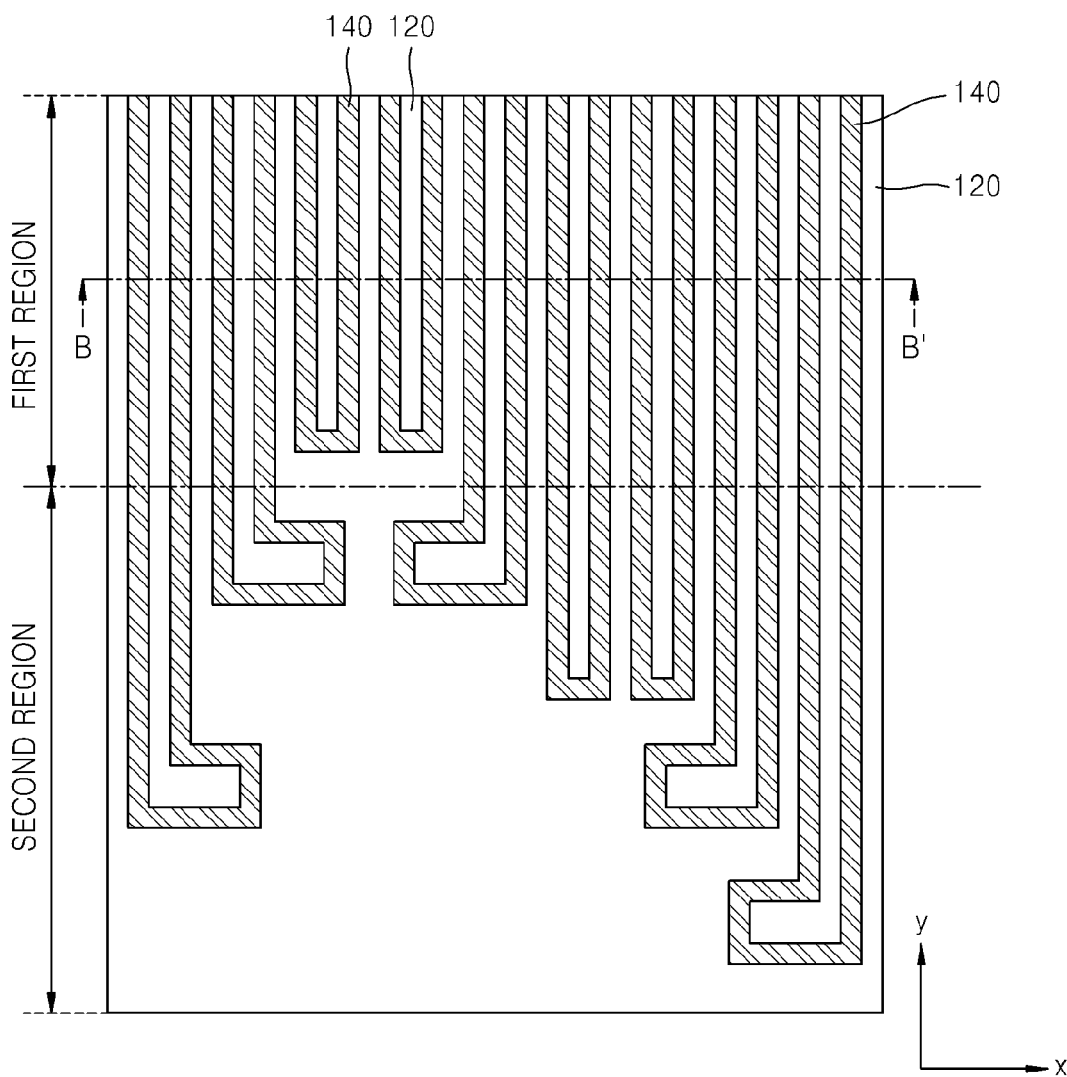
Figure 3B:
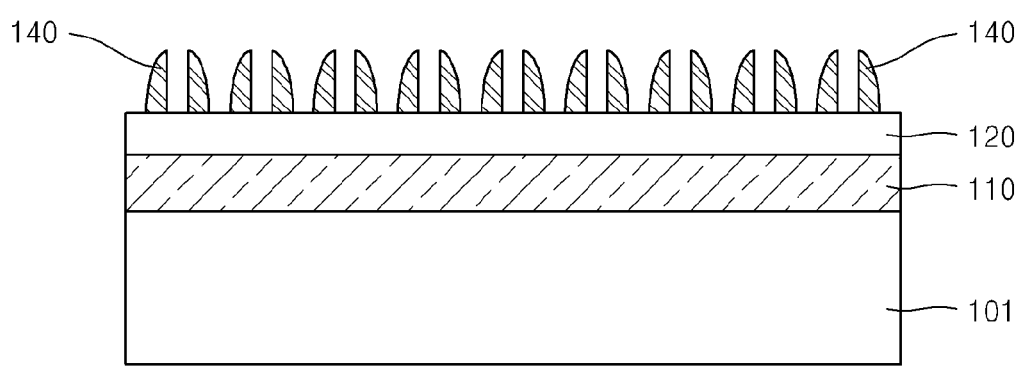

Next, referring to FIGS. 3A and 3B, the first pattern structures 130 are removed. Accordingly, the second pattern structures 140, namely, the spacers, have a stand-alone configuration as illustrated in FIG. 3B.

Next, part or all of each of respective ones of the second pattern structures 140 are removed. For example, if the line/space pattern to be transcribed onto the substrate 101 using the second pattern structures 140 comprises a series of word lines, then the second pattern structures 140 need to be trimmed so that the word lines are not formed as connected to one another. Furthermore, some of the spaces of a line/space pattern have to be wider than others. In this case, at least one of the second pattern structures 140 needs to be entirely removed.

Figure 4A:
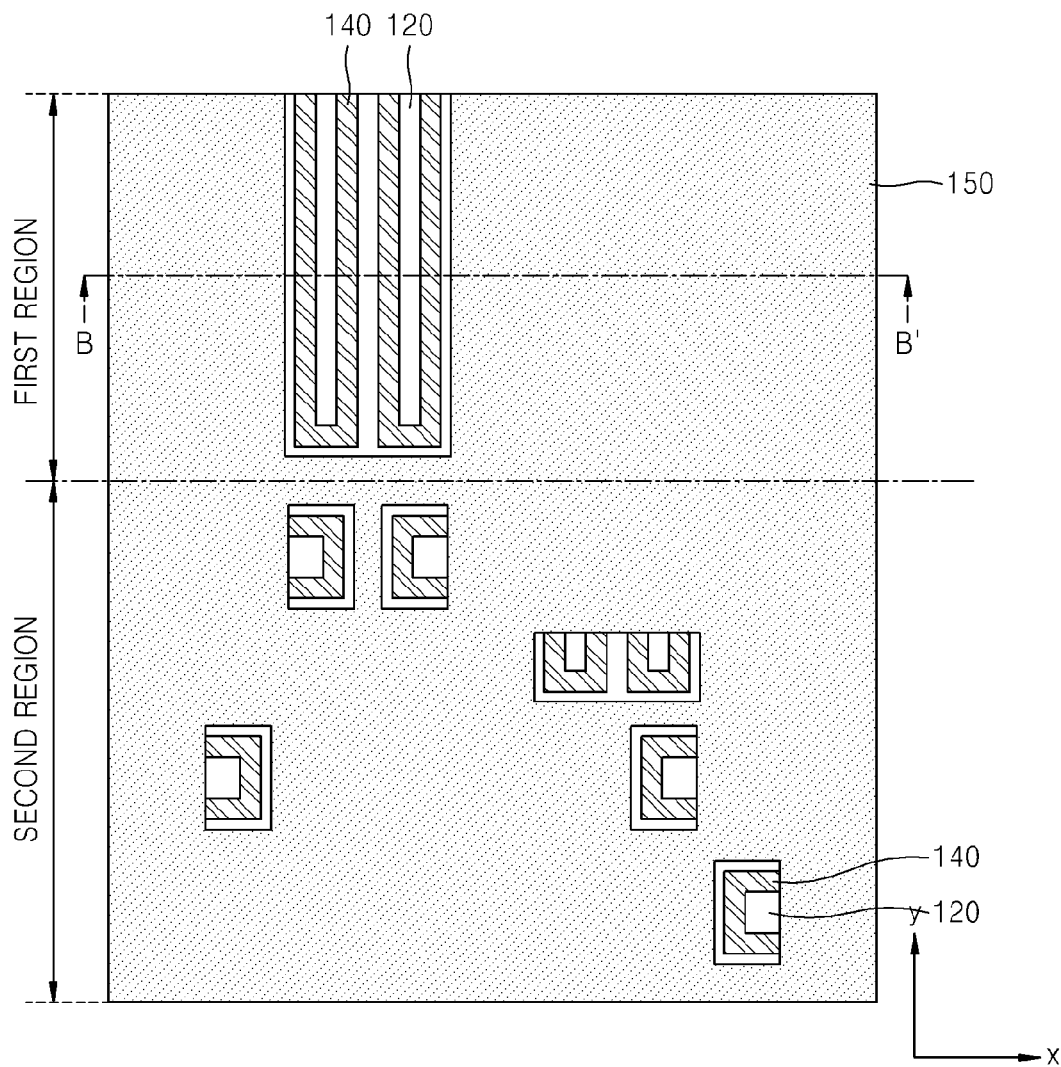
Figure 4B:
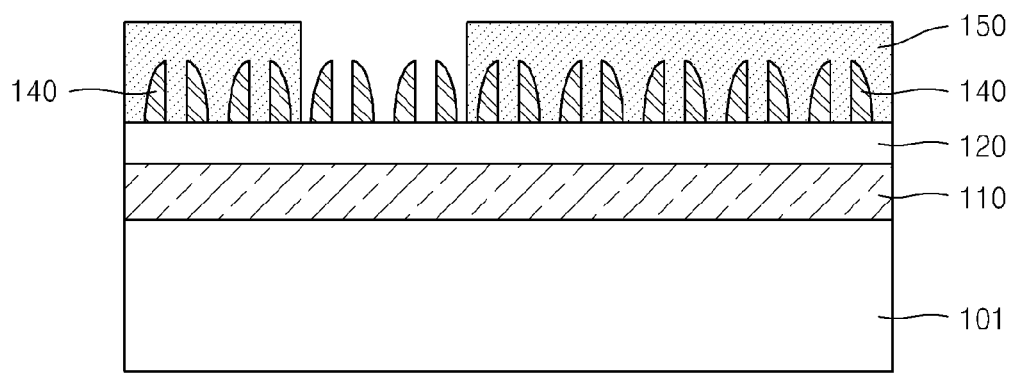

Such a process is shown in FIGS. 4A and 4B. In this process, a first mask 150 that exposes at least part, i.e., the entirety of or only part, of each of the second pattern structures 140 is formed on the sacrificial layer 120. The first mask 150 may be a photoresist pattern formed using a photolithographic process. For example, as illustrated in FIG. 4A, the first mask 150 exposes the entirety of respective ones of the second pattern structures 140 in a first region and only part of each of the second pattern structures 140 in a second region. Next, the second pattern structures 140 are etched using the first mask 150 as an etch mask. To this end, an isotropic etching process, such as wet etching, is used. It is noteworthy that only one mask is required in this process, i.e., for facilitating both the entire removal of one or more of the second pattern structures 140 and the trimming.

Figure 5A:
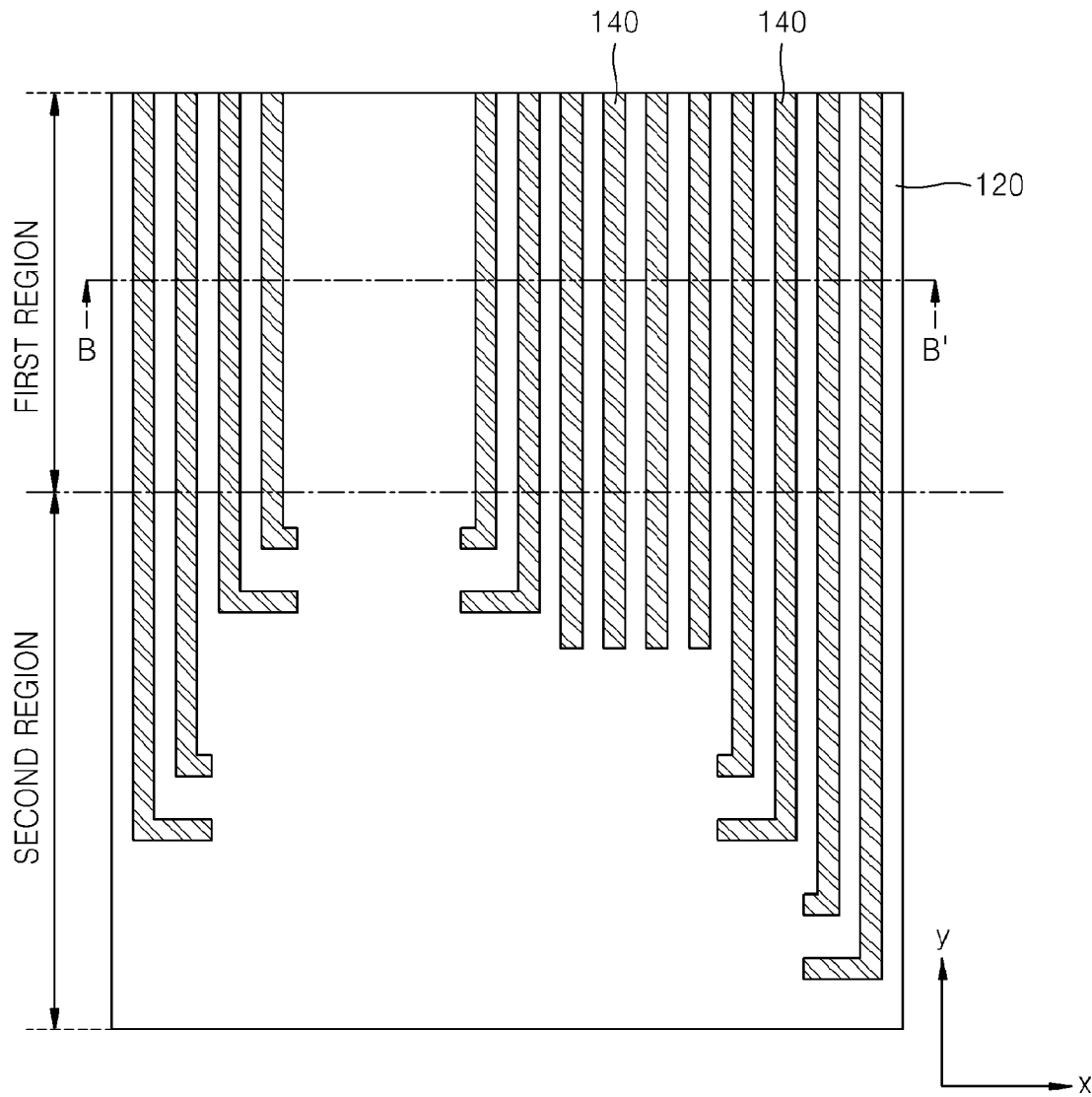
Figure 5B:
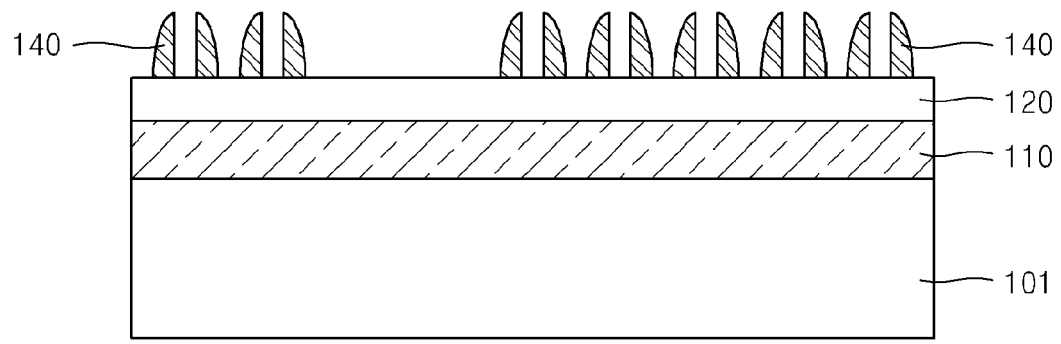

As shown in FIGS. 5A and 5B, as a result, those portions of the second pattern structures 140 which are exposed by the first mask 150 in the second region are removed, thereby leaving portions of the second structures 104 in the second region which will be referred to hereinafter as remnant second structures 104. On the other hand, the second pattern structures 140 which are exposed by the first mask 150 in the first region are entirely removed, thereby leaving others of the second pattern structures 140 in the first region. Referring still to FIG. 5A, the remnant second pattern structures 140 are disconnected from one another. As mentioned above, a reason for trimming the second pattern structures 140 is so that respective lines of the line/space pattern to be formed using the (remnant) second pattern structures 140 will not be connected, and a reason for removing one or more of the second pattern structures 140 entirely is so that at least one of the spaces of the line/space pattern to be formed will be wider than the others. In particular, when the distance between the second pattern structures 140 is substantially equal to the width of each of the second pattern structures 140 as described above, the width(s) of the wider space(s) will be an odd-numbered multiple of the width of the narrowest spaces.

Figure 6A:
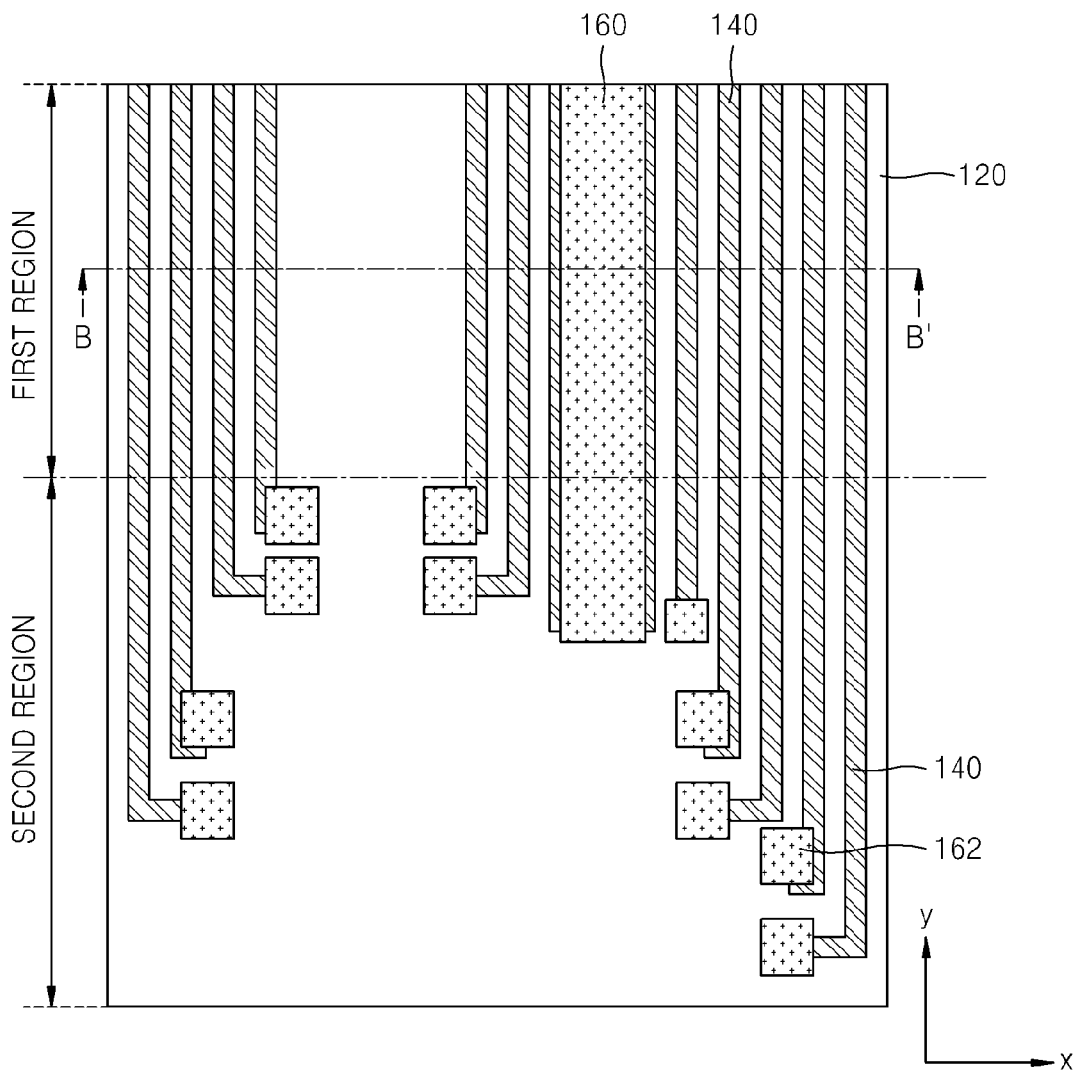

In general, pads are respectively formed at the ends of lines in order to facilitate the connection of the lines to other elements using interconnects extending perpendicular to the substrate. Referring to FIG. 6A, in order to form such pads, a second mask 160 including pad patterns 162 is formed on the sacrificial layer 120. The second mask 160 may be formed using a well-known photolithographic method, and thus, a description thereof will not be provided here.

The pad patterns are overlapped with ends, respectively, of remnant second pattern structures 140. The relative locations and sizes of the pad patterns 162 are determined in consideration of the amount of room around the ends of the remnant second pattern structures 140. Specifically, the pad patterns 162 are sized and positioned to prevent short circuits or excessive parasitic circuits from being created even when a slight misalignment occurs between the pads and the interconnects that will be formed on the pads.

Figure 6B:
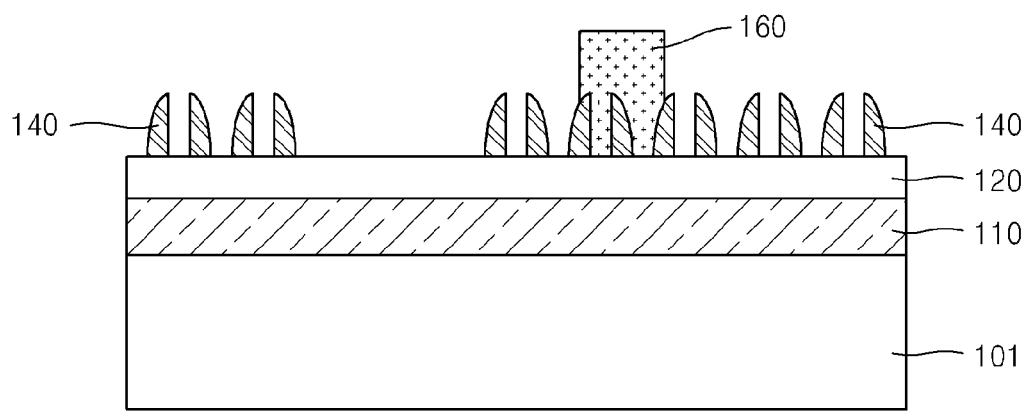

Referring to FIGS. 6A and 6B, the second mask 160 may also span two or more of the remnant second pattern structures 140. That is, the second mask 160 may include not only the pad patterns 162 but a line, the width of which is substantially greater than that of the remnant second pattern structures 140. As will become clear from the description that follows, the line of the second mask 160 is used to form a line of the line/space pattern whose width is greater than that of other lines of the line/space pattern. In the case in which the distance between adjacent ones of the second pattern structures 140 is substantially equal to the width of each of the second pattern structures 140, the width of this wider line of the line/space pattern to be formed will thus be an odd-numbered multiple of the width of the second pattern structure 140.

Figure 7A:
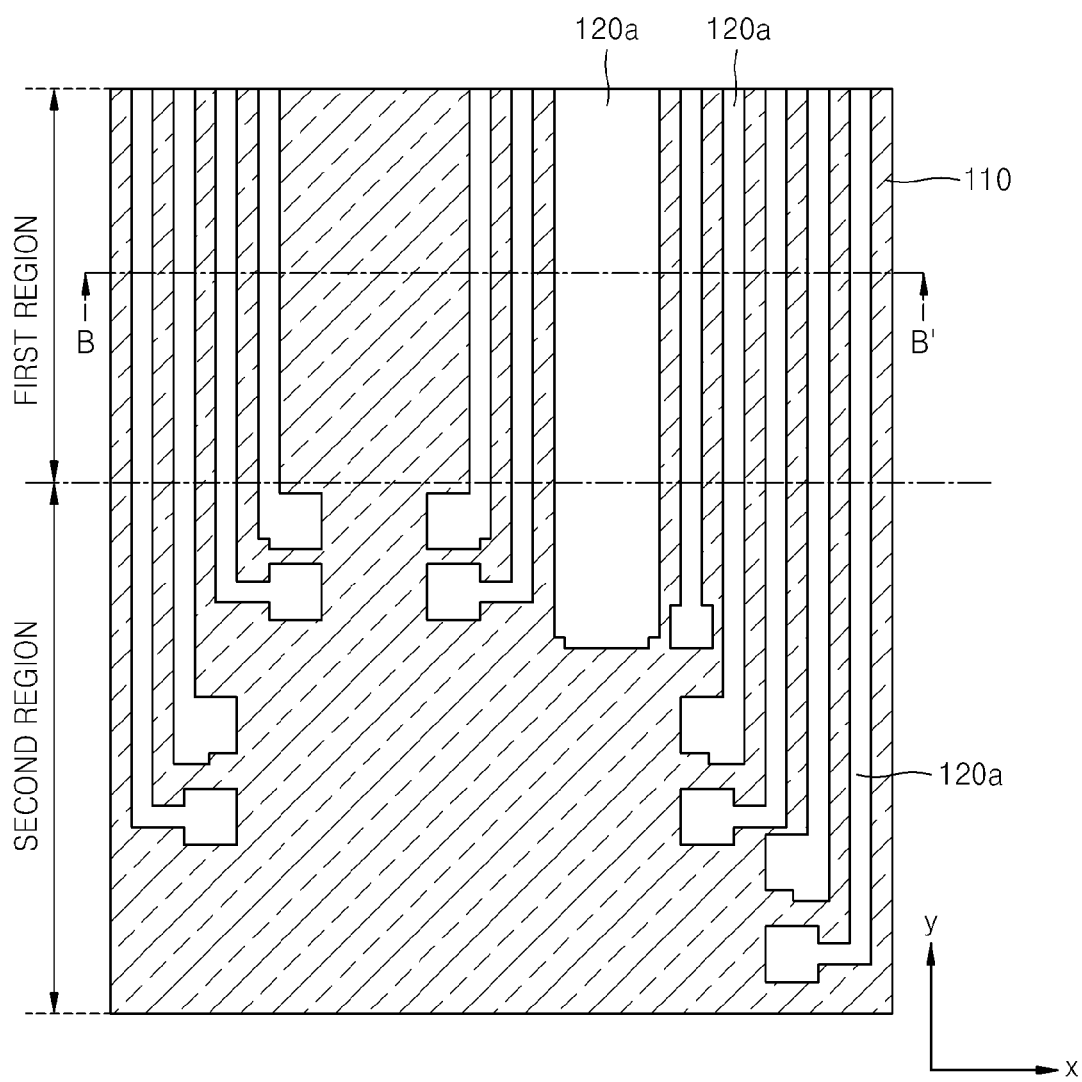
Figure 7B:
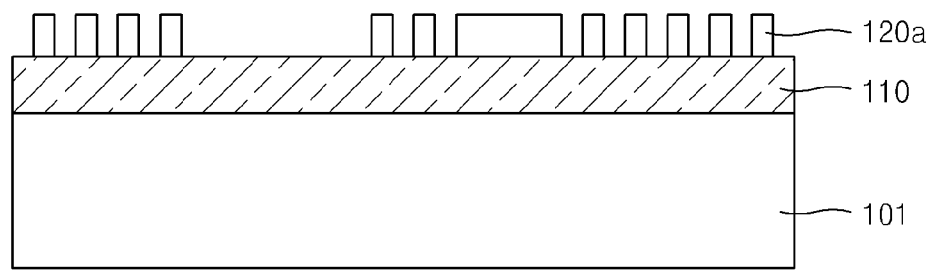
Figure 8:
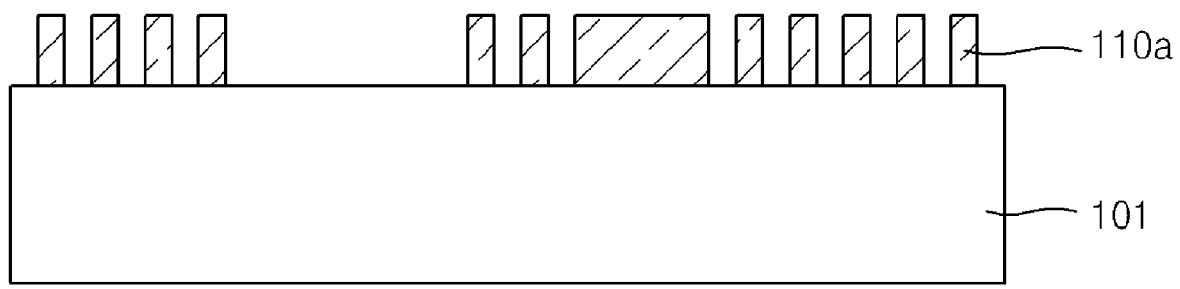

Next, referring to FIGS. 7A, 7B and 8, a sacrificial mask 120*a* is formed by anisotropically etching the sacrificial material layer 120 using the second mask 160 and the remnant second pattern structures 140 as an etch mask. Then, a hard mask 110*a* is formed by anisotropically etching the hard mask material layer 110 using the sacrificial mask 120*a*, the remaining portion of the second mask 160, and the remnant second pattern structures 140 as an etch mask.

Figure 9A:
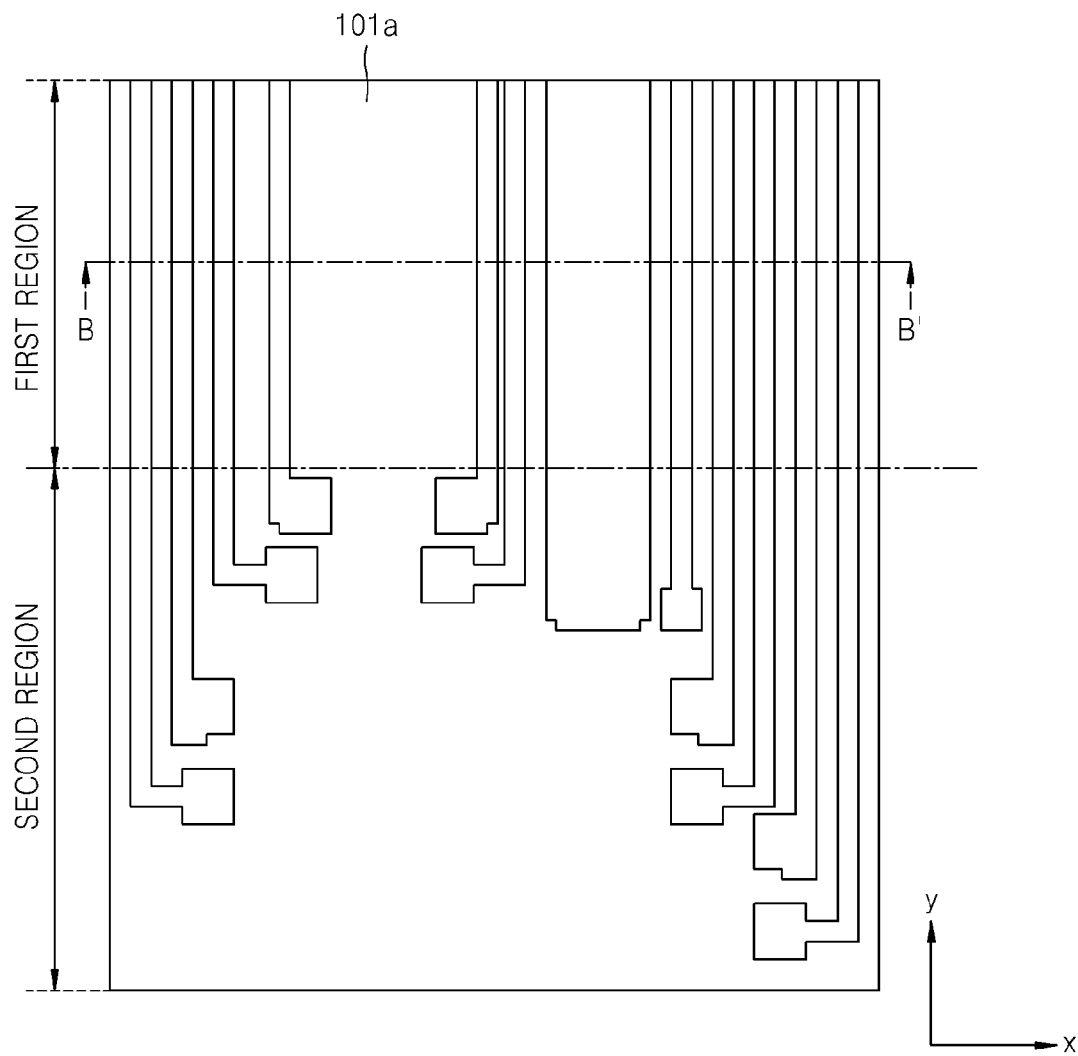
FIG. 9A is a plan view of the substrate illustrating a line/space pattern formed according to the inventive concept.
Figure 9B:
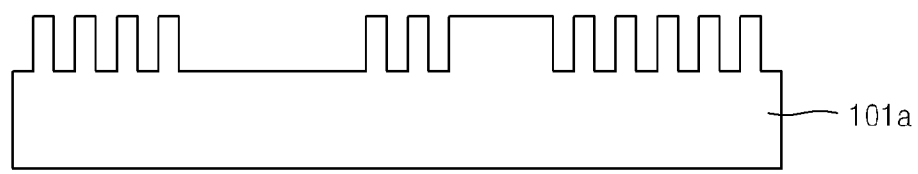

Referring to FIGS. 9A and 9B, the substrate 101 is etched using the hard mask 110*a* as an etch mask. Accordingly, a line/space pattern is formed at the upper portion of the substrate 101.

Figure 10:
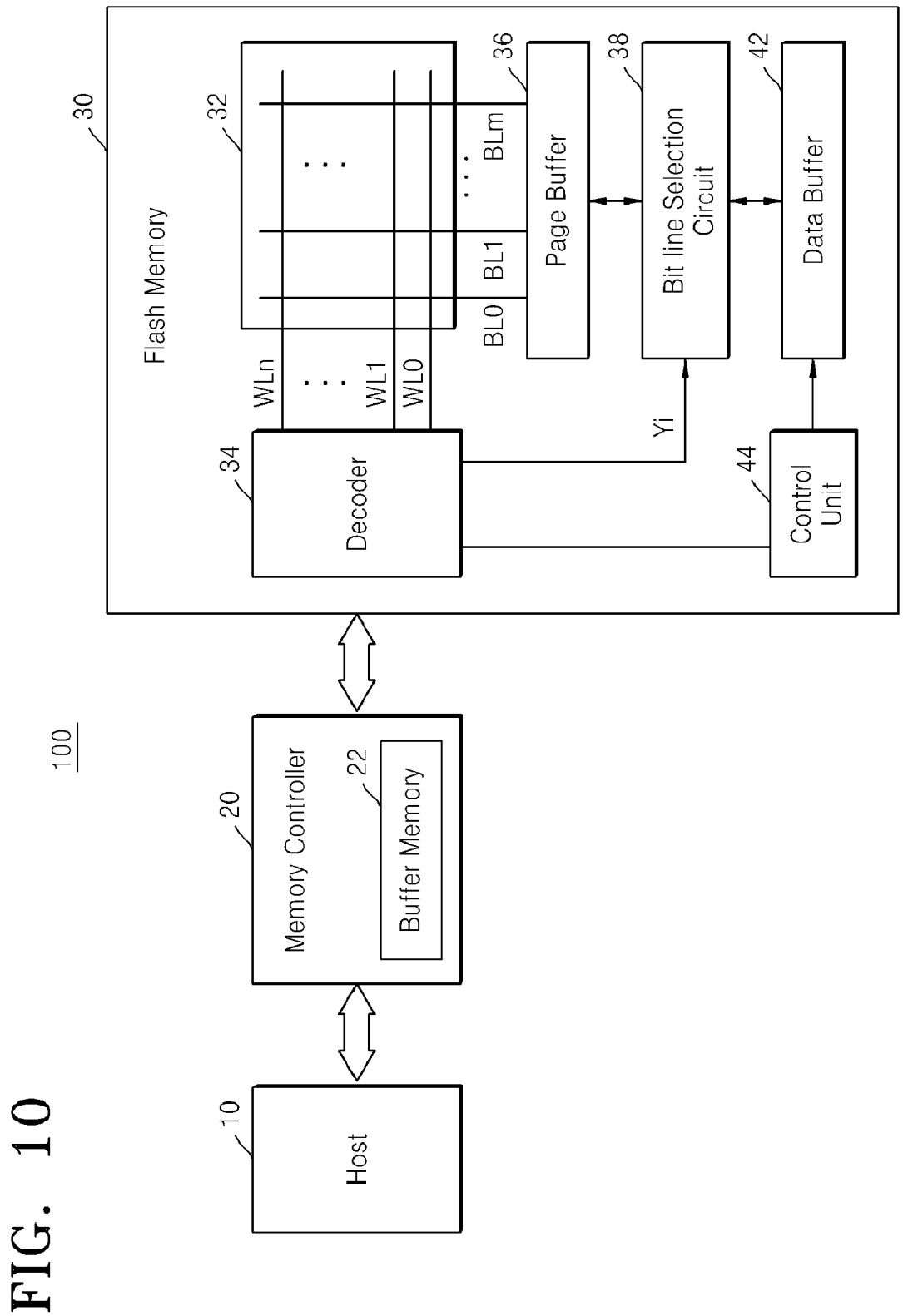
FIG. 10 is a block diagram of a memory system of a semiconductor device fabricated using a method of forming a line/space pattern according to the inventive concept.

FIG. 10 is a schematic diagram of a memory system 100 including a semiconductor device fabricated using a method according to the inventive concept. Referring to FIG. 10, the memory system 100 includes a host 10, a memory controller 20, and a flash memory 30.

The memory controller 20 functions as an interface between the host 10 and the flash memory 30 and includes a buffer memory 22. Although not shown, the memory controller 20 may further include a central processing unit (CPU), a read-only memory (ROM), a random access memory (RAM), and interface blocks.

The flash memory 30 may include a cell array 3, a decoder 34, a page buffer 36, a bit line selection circuit 38, a data buffer 42, and a control unit 44.

When data and a write command are supplied from the host 10 to the memory controller 20, the memory controller 20 controls the flash memory 30 to write the data to the cell array 32, in response to the write command. The memory controller 20 may also control the cell array 30 to read data from the cell array 32 in response to a read command received from the host 10. The buffer memory 22 temporarily stores data exchanged between the host 10 and the flash memory 30.

The cell array 32 of the flash memory 30 includes a plurality of memory cells. The decoder 34 is connected to the cell array 32 via a plurality of word lines WL0, WL1, . . . WLn. The decoder 34 receives an address from the memory controller 20 and generates a selection signal Yi in order to select a word line from among the word lines WL0, WL1, . . . WLn or to select a bit line from among a plurality of bit lines BL0, BL1, . . . BLm. The page buffer 36 is connected to the cell array 32 via the bit lines BL0, BL1, . . . BLm.

In the product shown in FIGS. 9A and 9B, the first region may be a cell array region in which unit memory devices are formed. For example, the first region may include the cell array 32 illustrated in FIG. 10. On the other hand, the second region may be a peripheral circuit region or a core region, in which peripheral circuits are formed to drive the unit memory devices in the first region.

According to the inventive concept as described above, there is provided a method of forming a line/space pattern having both a regular pattern and relatively wide lines and spaces in the same region, but which obviates or otherwise minimizes the optical proximity effect without resort to the use of a plurality of photomasks. Accordingly, the method is economical.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of forming a line/space pattern, comprising:
providing a substrate on which a layer of hard mask material is disposed;
forming a plurality of first pattern structures on the layer of hard mask material, the first pattern structures having sidewalls spaced apart from each other in a first direction, and the first pattern structures having linear sections that extend across a first region on the substrate and into a second region;
forming a plurality of second pattern structures in the form of sidewall spacers along the sidewalls of the first pattern structures, respectively, such that adjacent ones of the second pattern structures are spaced apart from each other in the first direction;
subsequently removing the first pattern structures;
forming a first mask that having an opening therethrough that exposes adjacent ones of the second pattern structures and covers others of the second pattern structures in the first region;
removing the second pattern structures which are exposed by the first mask in the first region, wherein the second pattern structures covered by the first mask remain;
forming a second mask comprising a section that extends across the first region and covers a section of the layer of hard mask material located between respective ones of the remaining second pattern structures in the first region, and wherein the second mask exposes in the first region respective ones of the remaining second pattern structures;
forming a hard mask by etching the layer of hard mask material using the second mask and the remaining second pattern structures as an etch mask; and
forming a line/space pattern by etching the substrate using the hard mask as an etch mask.

2. The method of claim 1, wherein the first pattern structures are formed such that respective ones of the first structures terminate in the second region, the first mask is formed so as to have trimming openings that expose portions of the second pattern structures in the second region, and the portions of the second pattern structures exposed by the trimming openings are removed along with the second pattern structures which are exposed by the first mask in the first region.

3. The method of claim 1, wherein the second mask comprises a pad pattern that overlies ends of respective ones of the second pattern structures in the second region.

4. The method of claim 1, wherein the second pattern structures are formed such that the distances between adjacent ones of the second pattern structures in the first direction are substantially the same.

5. The method of claim 4, wherein the second pattern structures are formed such that the distances between adjacent ones of the second pattern structures in the first direction are substantially equal to the widths of the second pattern structures in the first direction.

6. The method of claim 5, wherein the second pattern structures are formed so as to have the same widths in the first direction as the first pattern structures, and the second mask is formed such that said section thereof in the first region spans at least two of the second pattern structures, whereby the width of a line of the line/space pattern in the first region is an odd-numbered multiple of the width of each of the second pattern structures.

7. The method of claim 5, wherein the second pattern structures are formed so as to have the same widths in the first direction as the first pattern structures, and the first mask is formed such that the opening thereof is aligned with and exposes the second pattern structures that were formed along both sidewalls of at least one of the first structures, whereby the width of a space of the line/space pattern in the first region is an odd-numbered multiple of the width of each of the second pattern structures.

8. The method of claim 1, wherein the first and second pattern structures are formed such that the first pattern structures each have a width D1, the second pattern structures each have a width D2, and the distances between adjacent ones of the first pattern structures are each D1+2D2.

9. The method of claim 1, further comprising forming a sacrificial layer on the layer of hard mask material,
wherein the forming of the hard mask comprises:
forming a sacrificial mask by etching the sacrificial layer using the second mask and the remaining second pattern structures as an etch mask; and
subsequently etching the layer of hard mask material.

10. A method of forming a line/space pattern, comprising:
providing a substrate on which a layer of hard mask material is disposed;
forming a plurality of first pattern structures on the layer of hard mask material;
forming a plurality of second pattern structures along sidewalls of the first pattern structures;
removing the first pattern structures such that the second pattern structures stand alone on the layer of hard mask material;
forming a first mask that exposes a location where a space of the line/space pattern to be formed is to have a width greater than the distance between adjacent ones of the second pattern structures;
removing those of the second pattern structures which are exposed by the first mask such that others of the second pattern structures remain on the layer of hard mask material;
forming a second mask that covers a location where a line of the line/space pattern to be formed is to have a width that is greater than the widths of the second pattern structures;
forming a hard mask by etching the hard mask material layer using the second mask and the remaining second pattern structures as an etch mask; and
etching the substrate using the hard mask as an etch mask.

11. The method of claim 10, wherein the second pattern structures are formed such that the distances between adjacent ones of the second pattern structures are substantially the same.

12. The method of claim 11, wherein the second pattern structures are formed such that the distances between adjacent ones of the second pattern structures are substantially equal to the widths of the second pattern structures.

13. The method of claim 12, wherein the second pattern structures are formed so as to have the same widths as the first pattern structures, and the second mask is formed to span at least two of the second pattern structures, whereby the width of the line of the line/space pattern is an odd-numbered multiple of the width of each of the second pattern structures.

14. The method of claim 12, wherein the second pattern structures are formed so as to have the same widths as the first pattern structures, and the first mask is formed such that the opening thereof is aligned with and exposes the second pattern structures that were formed along both sidewalls of at least one of the first structures, whereby the width of the space of the line/space pattern is an odd-numbered multiple of the width of each of the second pattern structures.

15. The method of claim 10, wherein the first and second pattern structures are formed such that the first pattern structures each have a width D1, the second pattern structures each have a width D2, and the distances between adjacent ones of the first pattern structures are each D1+2D2.

16. The method of claim 10, further comprising forming a sacrificial layer on the layer of hard mask material,
wherein the forming of the hard mask comprises:
forming a sacrificial mask by etching the sacrificial layer using the second mask and the second pattern structures as an etch mask; and
subsequently etching the layer of hard mask material.

* * * * *